United States Patent [19]

Mimura et al.

[11] Patent Number: 4,954,855
[45] Date of Patent: Sep. 4, 1990

[54] THIN FILM TRANSISTOR FORMED ON INSULATING SUBSTRATE

[75] Inventors: Akio Mimura, Katsuta; Yoshikazu Hosokawa, Hitachiota; Takaya Suzuki, Katsuta; Takashi Aoyama, Ibaraki; Nobutake Konishi, Hitachiota; Yutaka Misawa; Kenji Miyata, both of Katsuta, all of Japan

[73] Assignee: Hitachi, Ltd., Tokyo, Japan

[21] Appl. No.: 113,360

[22] Filed: Oct. 28, 1987

Related U.S. Application Data

[63] Continuation of Ser. No. 848,474, Apr. 7, 1986, abandoned.

[30] Foreign Application Priority Data

Apr. 8, 1985 [JP] Japan .................................. 60-72636
Jun. 3, 1985 [JP] Japan ................................. 60-118811

[51] Int. Cl.$^5$ .............................................. H01L 29/78
[52] U.S. Cl. ...................................... 357/23.7; 357/2; 357/59; 357/67
[58] Field of Search ..................... 357/23.7, 59, 67 S, 357/2

[56] References Cited

U.S. PATENT DOCUMENTS

| | | | |
|---|---|---|---|
| 4,319,395 | 3/1982 | Lund et al. | 357/23 |
| 4,336,550 | 6/1982 | Medwin | 357/42 |
| 4,554,572 | 11/1985 | Chatterjee | 357/23.7 |
| 4,797,108 | 11/1989 | Crowther | 357/23.7 |

FOREIGN PATENT DOCUMENTS 56-7480 4/1981 Japan .................................. 357/23

OTHER PUBLICATIONS

IEEE Transactions on Electron Devices, ED-31, No. 9, Sep. 1984, pp. 1329-1334, Okabayashi et al., Snell,-App. Phys. 24, 357-362, (1981).

Primary Examiner—Edward J. Wojciechowicz
Attorney, Agent, or Firm—Antonelli, Terry, Stout & Kraus

[57] ABSTRACT

A thin film transistor formed on an insulating sulstrate is disclosed in which metal silicide layers are formed in a thin film made of a monocrystalline, polycrystalline, or amorphous semiconductor material, to be used as source and drain regions, and further a gate electrode includes a metal silicide layer.

22 Claims, 4 Drawing Sheets

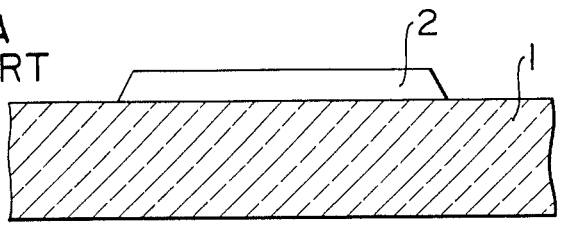
FIG. IA
PRIOR ART
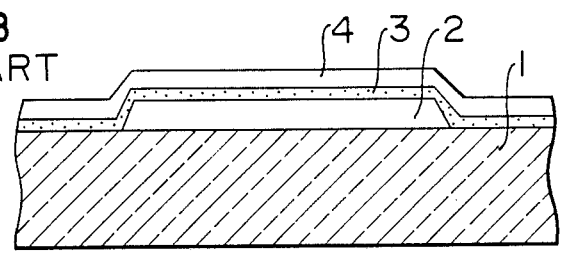
FIG. IB
PRIOR ART
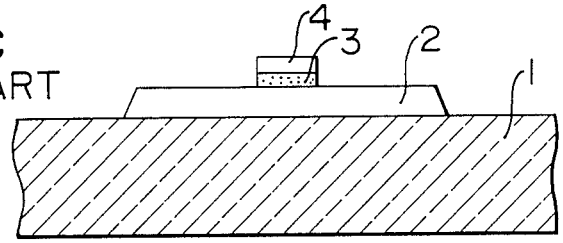
FIG. IC
PRIOR ART
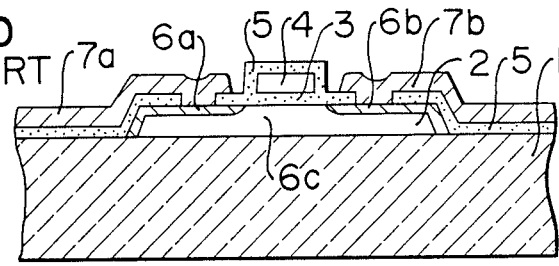
FIG. ID
PRIOR ART

ABSTRACT# THIN FILM TRANSISTOR FORMED ON INSULATING SUBSTRATE

This application is a continuation application of application Ser. No. 848,474, filed Apr. 7, 1986 now abandoned.

BACKGROUND OF THE INVENTION

The present invention relates to a semiconductor device, and more particularly to a thin film transistor formed on an insulating substrate.

A thin film transistor (hereinafter referred to as "TFT") using a semiconductor film which is formed on an insulating substrate is used for various purposes. In a case where a multiplicity of TFT's are integrated on a monocrystalline semiconductor film, a circuit for operating the TFT's does not include the capacitance between the semiconductor film and an insulating substrate for supporting the semiconductor film, and hence the TFT's can operate at a higher speed, as compared with an integrated circuit which is formed in a bulk semiconductor substrate through the well-known separation technique using a pn junction. Further, when a polycrystalline or amorphous semiconductor film is used in place of the monocrystalline semiconductor film, a thin film semiconductor device can be formed at a reduced temperature. For example, a thin film transistor array has been formed on a glass or quartz substrate, to be used in a liquid crystal display device. An example of a thin film semiconductor device which is formed by using the above-mentioned low-temperature process, is described in an article entitled "Thin-film transistors on molecular-beam-deposited polycrystalline silicon" by M. Matsui et al. (J. Appl. Phys., Vol. 55, No. 6, 1984, pages 1590 through 1595). However, such a prior art has drawbacks. In order to clearly show the drawbacks of the prior art, a method of fabricating a conventional thin film semiconductor device by using the low-temperature process will be explained below, by reference to FIGS. 1A to 1D.

Referring to FIG. 1A, a polycrystalline silicon film 2 having a thickness of 0.5 to 1 μm is formed on a glass substrate 1 by a chemical vapor deposition (CVD) method or the vacuum deposition method, and is selectively etched by photolithography so as to have the form of an island. Then, as shown in FIG. 1B, a silicon oxide film 3 which has a thickness of about 2,000Å and serves as a gate insulating film, and a polycrystalline silicon film 4 which has a thickness of about 5,000Å and serves as a gate material, are formed by a CVD method. Next, the silicon oxide film 3 and the gate polycrystalline silicon film 4 are selectively etched as shown in FIG. 1C. Then, phosphorous ions accelerated by an accelerating voltage of 100 KeV impinge upon the silicon island 2, to implant phosphorous in the silicon island 2 at a dose rate of $1 \times 10^{16}$ cm$^{-2}$, thereby forming source and drain regions in the silicon island 2. Thereafter, as shown in FIG. 1D, a protective film 5 having a thickness of about 5,000Å is formed by a CVD method, and the structure thus obtained is then kept at 550° C. for 10 hours, to activate phosphorous implanted in the silicon island 2 and to make the protective film 5 dense. Usually, the softening temperature of the glass substrate 1 is about 600° C. In order to carry out the above heat treatment without deforming the glass substrate 1, it is necessary to make the temperature of the heat treatment less than 600° C. Accordingly, it takes a lot of time to activate phosphorous implanted in the silicon island 2. Further, the use of the ion implantation method will increase the manufacturing cost of the device.

In other words, n-type, highly-doped regions 6a and 6b serving as source and drain regions are completely formed by the above heat treatment, and will be kept in low-resistance contact with an electrode material. Next, apertures for contact are formed in the protective film 5, and then a source electrode 7a and a drain electrode 7b each made of aluminium are deposited on the protective film 5, to be kept in contact with the source region 6a and the drain region 6b, respectively, through the apertures of the protective film 5. Thus, a TFT is completed. When a positive voltage is applied to the gate film 4 of the above TFT, an n-channel layer is formed in a channel region 6c of the silicon island 2 which exists between the source region 6a and the drain region 6b, and thus the TFT is put in an ON-state. When no voltage is applied to the gate film 4, the inherent (intrinsic) resistance of the channel region 6c is connected between the source region 6a and the drain region 6b, and thus the TFT is put in an OFF-state.

As explained above, according to the conventional low-temperature process using the ion implantation method, the cost for forming the source and drain regions becomes high, and moreover it takes a lot of time to activate implanted ions.

SUMMARY OF THE INVENTION

An object of the present invention is to provide a TFT in which both a source region and a drain region can be formed without using the ion implantation method.

Another object of the present invention is to provide a TFT in which both a source region and a drain region can be rapidly formed at a low temperature and at a low cost.

A further object of the present invention is to provide a TFT in which both a source region and a drain region are formed by a self alignment manner.

In order to attain the above objects, according to the present invention, there is provided a TFT in which both a source region and a drain region are made of metal silicide.

In general, the resistance of a TFT in the OFF-state is determined by the inherent resistance of the channel region of the TFT, and the TFT is not always required to include a pn junction. In view of these facts, in a TFT according to the present invention, both a source region and a drain region are made of metal silicide to reduce the resistivity of these regions.

BRIEF DESCRIPTION OF THE DRAWINGS

FIGS. 1A to 1D are longitudinal sectional showing a method of fabricating a conventional TFT, in a time sequential manner.

DESCRIPTION OF THE PREFERRED EMBODIMENTS

An embodiment of a TFT according to the present embodiment will be explained below. Similarly to the conventional TFT which has been explained by reference to FIGS. 1A to 1D, the present embodiment has a MOS (namely, metal-oxide-semiconductor) structure, as shown in FIG. 2D. Accordingly, when the present embodiment is fabricated, the same steps as shown in FIGS. 1A to 1C are first carried out. Now, a method of fabricating the present embodiment will be explained below, by reference to FIGS. 2A to 2D.

Figure 2A:
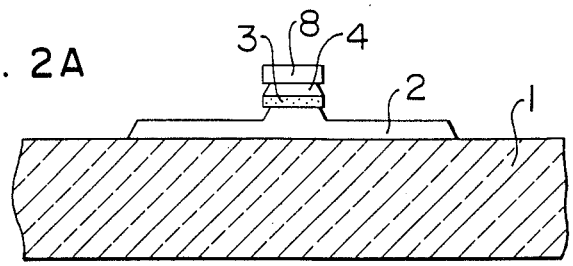
FIGS. 2A to 2D are longitudinal sectional views showing a method of fabricating an embodiment of a TFT according to the present invention, in a time sequential manner.
Figure 2B:
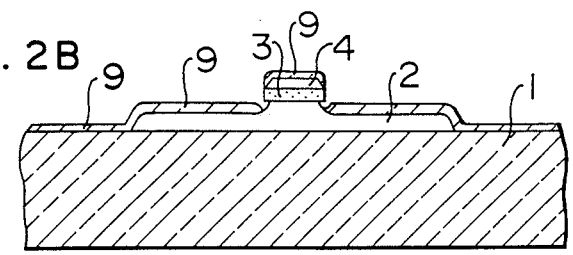
Figure 2C:
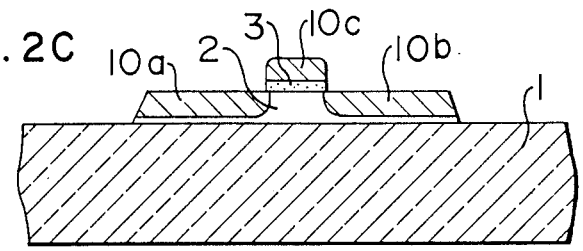
Figure 2D:
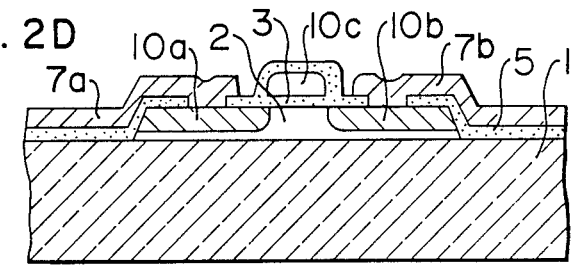

Referring to FIG. 2A, a resist film 8 is formed on the gate polycrystalline silicon film 4 which is deposited on the silicon oxide film 3 as shown in FIG. 1B, and then the films 4 and 3 are selectively etched by photolithography. That is, the gate polycrystalline silicon film 4 is first etched by the plasma etching using carbon tetrafluoride ($CF_4$) and oxygen, and then the silicon oxide film 3 is etched by the plasma etching using trifluoromethane ($CHF_3$) and helium. Thus, the same structure as shown in FIG. 1C is obtained. In the present embodiment, however, the polycrystalline silicon film 2 is then etched down by a thickness of about 1,000Å through the plasma etching using carbon tetrafluoride and oxygen. The plasma etching using carbon tetrafluoride and oxygen can perform isotropic etching for silicon. When the above etching is made more isotropic by adjusting the pressure of the above plasma gas and the oxygen content thereof, the under cut is formed in the gate polycrystalline silicon film 4 underlying the resist film 8 and in that portion of the polycrystalline silicon film 2 which exists beneath the silicon oxide film 3, as shown in FIG. 2A. In the present invention, it is very important to etch down a thin semiconductor film and to form the above-mentioned under cut. In order to make metal silicide which is one of intermetallic compounds, a platinum layer 9 having a thickness of about 500Å is deposited as shown in FIG. 2B, by the evaporation from above. At this time, platinum is not deposited on that portion of the polycrystalline silicon film 2 where the above-mentioned under cut is formed, and hence the platinum layer on the gate polycrystalline silicon film 4 is separated from the platinum layer on the polycrystalline silicon film 2. The structure thus obtained is annealed in oxygen atmosphere at about 450° C. for about 10 minutes, to form platinum silicide layers 10a to 10c as shown in FIG. 2C. When the platinum silicide layers 10a to 10c are formed, the volume of each of these layers 10a to 10c is increased. Thus, the under cut existing beneath the silicon oxide film 3 is occupied by the platinum silicide layers 10a and 10b, and the surface of the semiconductor island 2 including the platinum silicide layers 10a and 10b is put in substantially the same plane as the bottom of the silicon oxide film 3. Further, the platinum silicide layer 10c formed on the silicon oxide film 3 is separated by the film 3 from each of the platinum silicide layers 10a and 10b which serve as source and drain regions, respectively. That is, the short-circuiting between the platinum silicide layer 10c and each of the platinum silicide layers 10a and 10b never occurs. Accordingly, although a side wall which is usually formed on the side surface of the gate electrode of an FET (namely, field effect transistor), is not provided in the present embodiment, the short-circuiting between the gate film and each of the source and drain regions can be prevented. As mentioned above, the gate, source and drain layers can be formed which are highly conductive and of self alignment type. Referring now to FIG. 2D, the protective film 5 is then formed, and apertures for contact are formed in the protective film 5. Thereafter, the source and drain electrodes 7a and 7b each made of aluminium are deposited on the protective film 5, to be kept in ohmic contact with the silicide layers 10a and 10b, respectively, through the above apertures. Thus, the present embodiment is completed.

In the present embodiment, the polycrystalline silicon film is used as the semiconductor active film. However, a monocrystalline silicon film or an amorphous silicon film may be used in place of the polycrystalline silicon film. Further, the semiconductor film may be made of germanium, tellurium, or one of compound semiconductor materials such as cadmium selenide and gallium arsenide. Although platinum silicide is used as the metal silicide in the present embodiment, molybdenum, tungsten, titanium, palladium, mixtures of these metals or others may be used for making the metal silicide. In this case, the heat treatment at a temperature of 550° to 800° C. is required to make the highly conductive metal silicide. However, by heating only a region where the metal silicide is to be made, by a lamp or the like, the metal silicide can be made in a short time, without raising the temperature of the substrate. The glass substrate of the present embodiment may be replaced by a quartz substrate. Further, the glass substrate may be replaced by semiconductor substrate coated with an insulating film. That is, it is essential that the substrate 1 acts as an insulator when viewed from the semiconductor film 2.

Next, explanation will be made of another embodiment of a TFT according to the present invention, by reference to FIGS. 3A and 3B. In the present embodiment, the thin semiconductor film is made of polycrystalline silicon, and the gate portion is made of amorphous silicon.

Figure 3A:
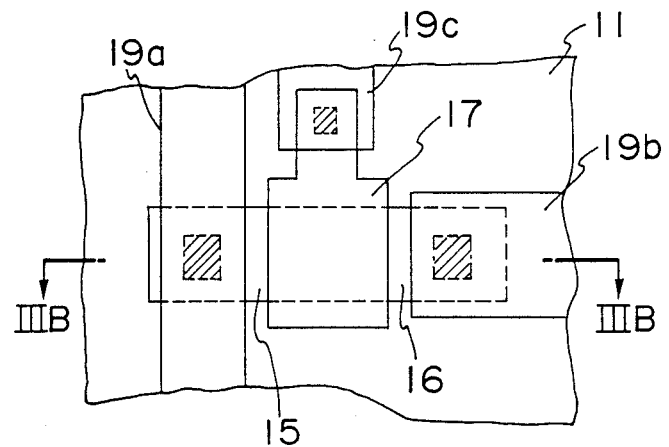
FIG. 3A is a plan view showing another embodiment of a TFT according to the present invention.
Figure 3B:
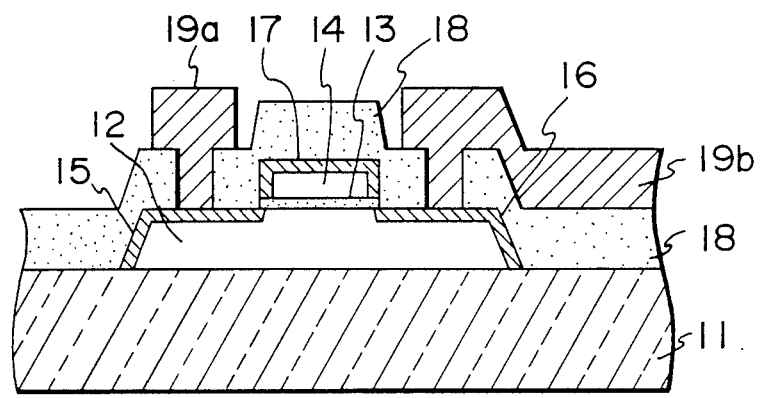
FIG. 3B is a longitudinal sectional view taken along the line IIIB—IIIB of FIG. 3A.

Referring to FIG. 3A which is a plan view of the present embodiment, and FIG. 3B which is a sectional view taken along the line IIIB—IIIB of FIG. 3A, a silicon island 12 formed of a thin polycrystalline silicon film is provided on an insulating substrate 11, and an amorphous silicon film 14, doped with an n-type impurity and hydrogen, is formed on a gate insulating film 13 which is provided on the silicon island 12. Further, metal silicide layers 15 and 16 serving as source and drain regions are formed in the surface of the silicon island 12, and a metal silicide layer 17 is formed in the surface of the amorphous silicon film 14. The metal silicide layer 17 and the amorphous silicon film 14 serve as a gate electrode. A surface passivation film 18 is provided so as to cover the metal silicide layers 15 to 17, and through holes are formed in the surface passivation film 18, so that a source electrode 19a and a drain electrode 19b which are provided on the surface passivation film 18, are kept in ohmic contact with the source and drain regions, respectively, through the through holes. In FIG. 3A, the gate insulating film 13 and the surface passivation film 18 are omitted for convenience sake, and hatched portions indicate areas where the metal silicide layers 15, 16 and 17 are kept in ohmic contact with the source electrode 19a, the drain electrode 19b and gate wiring 19c, respectively.

The source and drain regions formed of the metal silicide layers 15 and 16 are well bonded to the gate and drain electrodes 19a and 19b, respectively. Further, each of the source and drain regions has a low sheet resistivity in a lateral direction, and the series connection of the source and drain regions has a low resistance value. Further, even if those portions of the silicon island 2 where the metal silicide layers 15 and 16 are formed, are extended to form source wiring and drain wiring, the resistance of each of the source wiring and the drain wiring will not become too large. Similarly, the gate electrode, that is, the amorphous silicon film 14 covered with the metal silicide layer 17, has a small sheet resistivity in a lateral direction, and may be extended to form the gate wiring 19c or to be connected to other TFT's.

Hydrogen scarcely permeates a metal silicide layer. Since the upper and side surfaces of the amorphous silicon film 14 are coated with the metal silicide layer 17, it is hard for hydrogen contained in the amorphous silicon film 14 to escape to the outside. Accordingly, in the heat treatment for making the metal silicide layers 15 to 17 and the subsequent heat treatment, hydrogen in the amorphous silicon film 14 is diffused in the polycrystalline silicon film 12 through the gate insulating film 13, and thus the silicon film 12 is readily hydrogenated. The hydrogenation improves the characteristics of TFT's drastically.

In the present embodiment, hydrogen contained in the amorphous silicon film 14 and polycrystalline silicon film 12 is unescapable, except the escape of hydrogen at the side surface of the gate insulating film 13. Accordingly, even if the heat treatment at a temperature exceeding 400° C. is carried out, the bonding between silicon atoms and hydrogen atoms will be stable by the aid of the shielding hydrogen atom (dangling bonds being annihilated) and the resistance of the gate electrode will be kept at a low value. Further, the characteristics of the present embodiment scarcely vary with time. The above facts also hold in a case where the silicon island 12 is formed of a hydrogen-doped amorphous silicon film and a polycrystalline silicon film is used in place of the amorphous silicon film 14, to form the gate electrode.

Next, a method of fabricating the present embodiment will be explained below, by reference to FIGS. 4A to 4G.

Figure 4A:
FIGS. 4A to 4G are longitudinal sectional views showing a method of fabricating the embodiment of FIGS. 3A and 3B, in a time sequential manner.
Figure 4B:
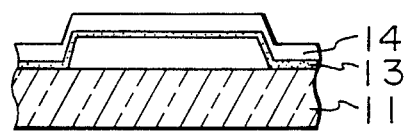
Figure 4C:
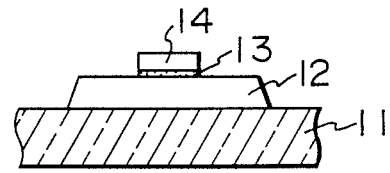
Figure 4D:
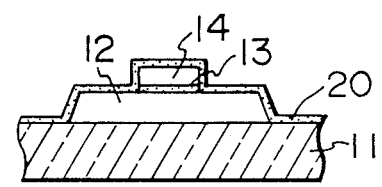
Figure 4E:
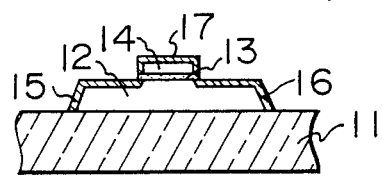

Referring to FIG. 4A, a polycrystalline silicon film is deposited on the insulating substrate 11, and then shaped by photo-etching techniques so as to form the silicon island 12. Next, as shown in FIG. 4B, the silicon oxide film 13 is deposited by a CVD method, to form the gate insulating film, and then the amorphous silicon film 14 doped with hydrogen and an n-type impurity is formed on the silicon oxide film 13 by a CVD method such as a plasma CVD method. Thereafter, as shown in FIG. 4C, the amorphous silicon 14 is selectively etched by photo-etching techniques, and then etching is performed for the silicon oxide film 13 while using the remaining amorphous silicon film as a mask, to remove the unwanted portion of the silicon oxide film 14. Next, a metal layer 20 is deposited by the sputtering method or others, as shown in FIG. 4D. Then, the heat treatment at a temperature of 200° to 500° C. is carried out to cause the metal to react with silicon, thereby forming the metal silicide layers 15 to 17 as shown in FIG. 4E. Thereafter, the metal layer 20 on the side surface of the silicon oxide film 13 and the remaining metal layer 20 on the surface of the substrate 11 are removed by an acid.

Figure 4F:
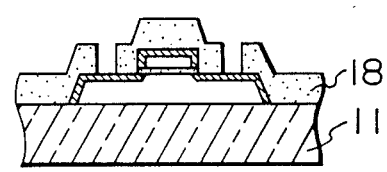
Figure 4G:
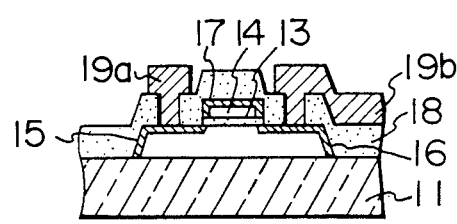

Next, as shown in FIG. 4F, the surface passivation film 18 is made of silicon oxide, phosphosilicate glass, silicon nitride, or others, and then through holes are formed in the surface passivation film 18 by photo-etching techniques. Then, an electrode layer is formed on the surface passivation film 18 by the sputtering method or others, and patterning is carried out for the electrode layer by photo-etching techniques, to obtain the source electrode 19a and the drain electrode 19b as shown in FIG. 4G.

In the above process, a channel region of the silicon island 12 which exists beneath the gate insulating film 13, is hydrogenated by the heat treatment for making the metal silicide layers 15 to 17. However, after the above heat treatment has been completed, additional heat treatment may be carried out at a more elevated temperature, to facilitate the diffusion of hydrogen into the silicon island 12.

In the above explanation, the silicon island 12 is made of polycrystalline silicon. However, an amorphous silicon film may be deposited on the insulating substrate 11, to form the silicon island 12, and a polycrystalline silicon film is deposited in place of the amorphous silicon film 14, to form the gate electrode. Further, the present invention is applicable to a p-channel MOSFET and an n-channel MOSFET in each of which an impurity is diffused into those portions of the thin film 12 which are kept in contact with the source and drain electrodes. Furthermore, the whole of the silicon islands 12 except the channel region thereof may be occupied by the metal silicide.

A metal for making the metal silicide may be one selected from a group consisting of platinum, molybdenum, tungsten, titanium palladium and mixtures of these metals.

As has been explained in the foregoing, according to the present invention, a TFT having a self alignment structure can be fabricated at a low temperature in a short time, and the sheet resistivity of the gate electrode can be reduced because the metal silicide layer is formed in the gate electrode. Further, the polycrystalline silicon layer is hydrogenated by the heat treatment for forming the metal silicide layers, that is, can be hydrogenated without increasing the number of fabricating steps. Even when additional heat treatment may be carried out after the heat treatment for forming the metal silicide layers has been completed, there is no fear of hydrogen escaping from a silicon film to the outside, and hence the TFT has stable characteristics.

We claim:

1. A coplanar thin film transistor formed on an insulating substrate, comprising:

a glass substrate;

a thin semiconductor film formed on said glass substrate and having the form of an island, said thin semiconductor film being in one of a polycrystalline state and an amorphous state and including silicon;

a gate structure formed on part of the thin semiconductor film, the gate structure including a gate insulating film and a gate electrode formed on the gate insulating film and made of platinum silicide, said gate insulating film being formed on said thin semiconductor film; and a pair of intermetallic compound layers formed in said thin semiconductor film at such locations that a portion of said thin semiconductor film which exists beneath said gate insulating film is sandwiched between said intermetallic compound layers, each of the intermetallic compound layers being formed of a metal silicide, the pair of intermetallic compound layers respectively constituting a source region and a drain region of the transistor, and said portion of said thin semiconductor film being a channel between the source and drain regions, and each of said intermetallic compound layers being insulated from said gate electrode by said gate insulating film, the metal silicide of each of said intermetallic compound layers being formed of a metal and silicon forming said thin semiconductor film.

2. A coplanar thin film transistor according to claim 1, wherein a metal for making said intermetallic compound layers is selected from a group consisting of platinum, molybdenum, tungsten, titanium, palladium and mixtures of these metals.

3. A coplanar thin film transistor according to claim 1, wherein said gate electrode includes a first layer made of a semiconductor material and a second layer made of platinum silicide.

4. A coplanar thin film transistor according to claim 3, wherein said first layer is in one of a polycrystalline state and an amorphous state.

5. A coplanar thin film transistor according to claim 3, wherein said first layer is in one of a polycrystalline state and an amorphous state, and each of said first layer and said thin semiconductor film contains hydrogen.

6. A coplanar thin film transistor according to claim 1, wherein said gate electrode and said intermetallic compound layers serve as conductors for connecting a plurality of thin film transistors.

7. A coplanar thin film transistor according to claim 1, further comprising lead-out conductors formed respectively on said pair of intermetallic compound layers.

8. A coplanar thin film transistor according to claim 1, wherein said intermetallic compound is a compound formed at the interface of said metal and semiconductor material when heating the metal and semiconductor material.

9. A coplanar thin film transistor according to claim 1, wherein the surface of the thin semiconductor film furthest from the substrate is substantially planar with the pair of intermetallic compound layers and is in substantially the same plane as the bottom of the gate insulating film.

10. A coplanar thin film transistor according to claim 1, wherein said portion of the thin semiconductor film constituting a channel between the source and drain contains hydrogen.

11. A coplanar thin film transistor according to claim 1, wherein the source and drain regions of the transistor consist essentially of said intermetallic compound layers.

12. A coplanar thin film transistor according to claim 1, wherein said pair of intermetallic compound layers are in self-alignment with the gate structure.

13. A coplanar thin film transistor according to claim 1, wherein said portion of said thin semiconductor film is a portion undercut beneath the gate insulating film, whereby the gate insulating film extends beyond the periphery of said portion of said thin semiconductor film.

14. A coplanar thin film transistor according to claim 13, wherein the surface of the thin semiconductor film furthest from the substrate is substantially planar with the pair of intermetallic compound layers and is in substantially the same plane as the bottom of the gate insulating film.

15. A coplanar thin film transistor according to claim 1, wherein the glass substrate is made of a glass having a softening temperature of about 600° C.

16. A coplanar thin film transistor according to claim 15, wherein the metal of the metal silicide of each of the intermetallic compound layers is platinum.

17. A coplanar thin film transistor according to claim 1, wherein the metal of the metal silicide of each of the intermetallic compound layers is platinum.

18. A coplanar thin film transistor formed on an insulating substrate, comprising:
    a glass substrate;
    a thin semiconductor film formed on said glass substrate and having the form of an island, said thin semiconductor film being in one of a polycrystalline state and an amorphous state and including silicon;
    a gate structure formed on part of the thin semiconductor film, the gate structure including a gate insulating film and a gate electrode formed on the gate insulating film and made of platinum silicide, said gate insulating film being formed on said thin semiconductor film; and
    a pair of intermetallic compound layers formed in said thin semiconductor film at such locations that a portion of said thin semiconductor film which exists beneath said gate insulating film is sandwiched between said intermetallic compound layers, each of the intermetallic compound layers being formed of a metal silicide, the pair of intermetallic compound layers respectively constituting a source region and a drain region of the transistor, and said portion of said thin semiconductor film being a channel between the source and drain regions, and each of said intermetallic compound layers being insulated from said gate electrode by said gate insulating film, the metal silicide of each of said intermetallic compound layers being formed of a metal and silicon forming said thin semiconductor film;
    wherein the gate electrode and pair of intermetallic compound layers are a gate electrode and layers formed by providing said gate insulating film on said thin semiconductor film and a silicon layer on the gate insulating film; etching the thin semiconductor film so as to undercut the gate insulating film; after the etching, depositing a platinum film on silicon of the thin semiconductor film, and on the silicon layer on the gate insulating film; and forming platinum silicide of the intermetallic compound layers and of the gate electrode by annealing, whereby the gate electrode and intermetallic compound layers are in self-alignment.

19. A coplanar thin film transistor according to claim 18, wherein the silicon layer on the gate insulating film is a polycrystalline silicon layer.

20. A coplanar thin film transistor according to claim 18, wherein the glass substrate is made of a glass having a softening temperature of about 600° C.

21. A coplanar thin film transistor according to claim 18, wherein the thin semiconductor film is made solely of amorphous or polycrystalline silicon.

22. A coplanar thin film transistor according to claim 21, wherein the glass substrate is made of a glass having a softening temperature of about 600° C.

* * * * *